United States Patent [19]
Fujii et al.

[11] Patent Number: 5,574,280
[45] Date of Patent: Nov. 12, 1996

[54] FOCUSED ION BEAM APPARATUS AND METHOD

[75] Inventors: Toshiaki Fujii; Tatsuya Adachi, both of Tokyo, Japan

[73] Assignee: Seiko Instruments Inc., Tokyo, Japan

[21] Appl. No.: 204,468

[22] Filed: Mar. 1, 1994

[30] Foreign Application Priority Data

Mar. 2, 1993 [JP] Japan ................................. 5-041560

[51] Int. Cl.$^6$ ................................................. H01J 37/30
[52] U.S. Cl. ................................. 250/309; 250/492.21
[58] Field of Search ........................... 250/309, 492.1, 250/492.2, 492.21, 492.3

[56] References Cited

U.S. PATENT DOCUMENTS

| | | | |
|---|---|---|---|
| 4,088,895 | 5/1978 | Martin | 250/309 |
| 4,638,209 | 1/1987 | Asamaki et al. | 313/359.1 |
| 4,983,830 | 1/1991 | Iwasaki | 250/309 |
| 5,083,033 | 1/1992 | Komano et al. | 250/492.21 |
| 5,164,596 | 11/1992 | Noguchi et al. | 250/309 |

*Primary Examiner*—Jack I. Berman
*Assistant Examiner*—James Beyer
*Attorney, Agent, or Firm*—Spensley Horn Jubas & Lubitz

[57] ABSTRACT

A sample semiconductor device which is processed and/or observed with the focused liquid metal ion beam can be returned again to the manufacturing process in this invention. The metal ions used in this apparatus are generally Ga ions. Ga ions contaminate a semiconductor device and a semiconductor manufacturing apparatus by auto-doping. An area which is irradiated with a focused liquid metal ion is doped by the metal ions which are subsequently removed by irradiation with a gas ion beam or covered by hard fusing metal.

5 Claims, 7 Drawing Sheets

FOCUSED ION BEAM APPARATUS AND METHOD

BACKGROUND OF THE INVENTION

This invention relates to a focused ion beam apparatus and a method for using the apparatus. The apparatus and method are used for processing a predetermined area on a sample by irradiation with the focused ion beam and by scanning, and/or observing the sample surface by detecting secondary particles generated by the irradiation with the focused ion beams.

Figure 5:
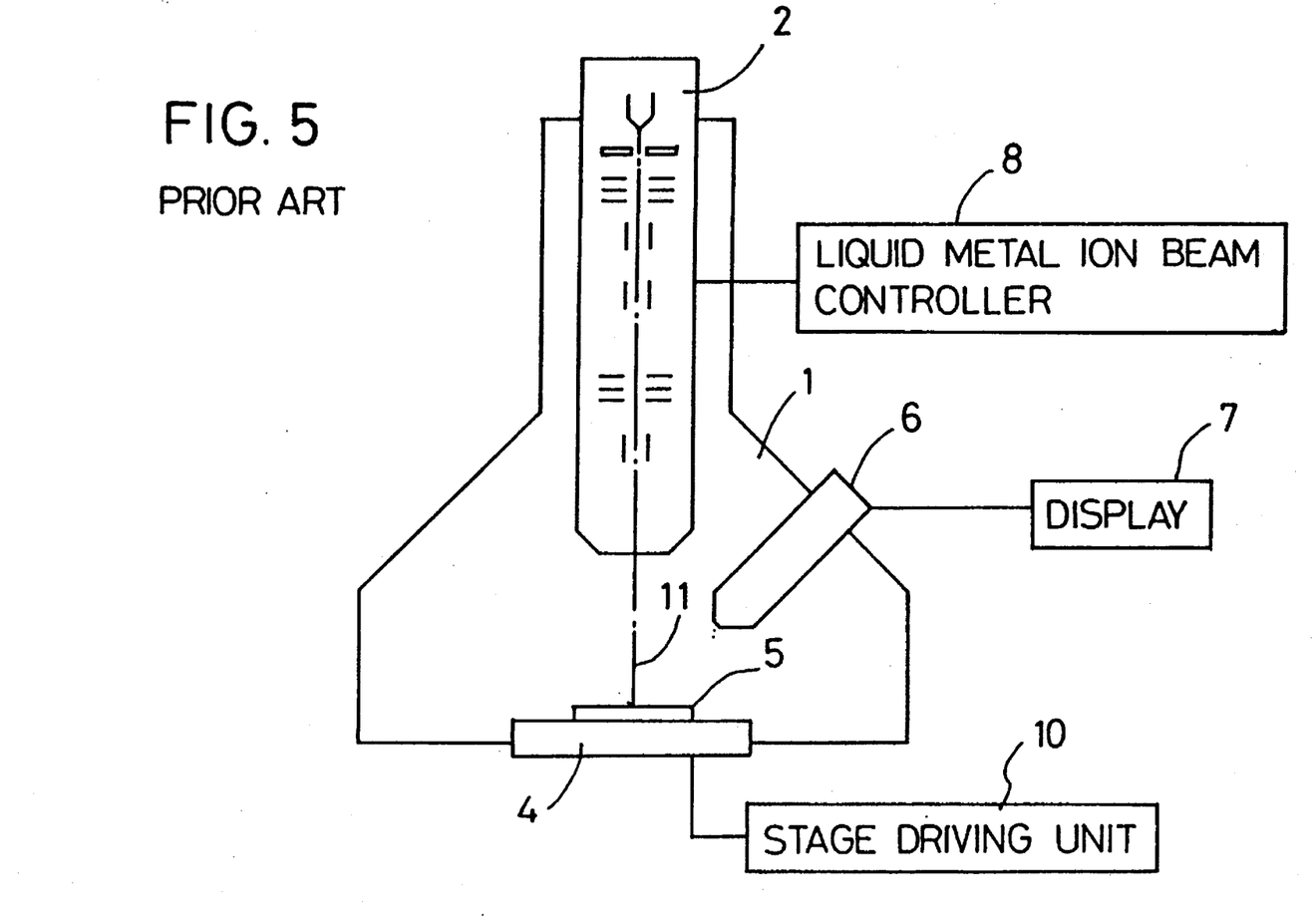
FIG. 5 shows the cross section of the prior art.

A focused ion beam apparatus of the prior art will be described below with reference to FIG. 5. As shown in Tokkaisho 59-16852, the focused ion beam apparatus in the prior art includes a sample chamber 1, an ion beam irradiation unit 2 having an extraction electrode for extracting ions from a liquid metal ion source of Ga, etc., an aperture and an electrostatic electrode for focusing the ions into a focused ion beam 11, and a deflection electrode for directing the focused ion beam 11 at the predetermined area of the sample 5 surface by deflecting and scanning the focused ion beam 11. By repeated irradiation at the sample 5 surface with the focused ion beam 11, the sample 5 surface at the predetermined area is sputtered with the focused ion beam 11. In this manner, the etching process for forming a vertical side wall on the sample 5 is performed. That is, the surface portion of the sample 5 is processed to form a section. And the secondary particles generated by the irradiation at the section with the focused ion beam are detected by a detector 6, and then the image of the section is displayed on the display 7.

Ions, which are used for the focused ion beam processing on the sample in the prior art, are doped into the sample. By the phenomenon of the doped ion, the characteristics at the area irradiated with the focused ion beam are changed. Next, an example using Ga as the ion source of the ion irradiation unit which irradiates, with the focused ion beam, a Si substrate 36 as the sample 5 will be explained below with reference to FIG. 6A. A Ga ion beam 11 having high energy impacts the Si substrate 36. As a part of the Ga ions 37 are doped at the Si substrate 36, the processed and displayed area of the sample 5 is contaminated. As especially, Ga is one of the Group III elements, Ga in the Si substrate 36 behaves as a P-type impurity and forms impurity diffusion area 35. And then the distribution of the impurity diffusion concentration of sample 5 changes. Ga ions 37 dope at a high diffusion rate, react with Al which is used as a wiring and then the Al wiring is highly eroded by Ga ions. When such a contaminated sample 5 or a Si substrate 36 is returned to a manufacturing process, the Ga which has been doped in the substrate 36, auto-dopes itself in heating processes and manufacturing apparatuses used in such processes can be contaminated with Ga. Therefore, the sample 5 which is processed and/or observed with the focused ion beam apparatus can not be returned into the manufacturing process, which is a problem.

SUMMARY OF THE INVENTION

In order to solve the above problems, this invention is developed.

The first means is that an irradiation unit for irradiating with particles which do not have a bad influence on a semiconductor substrate (for example, Ar ions, oxygen ions, oxygen radicals etc.) is further provided to the prior apparatus. The area which is changed on the wiring or which is processed and/or observed by the focused (liquid metal) ion beam is cleaned by irradiating and sputtering with a particle beam which does not have a bad influence on the substrate, and then the ion doped into the sample is removed.

The second means is that the sample which is cleaned off the doped ions (i.e. Ga) by the above process is wet washed and the natural oxide film formed on the surface is etched off by wet processing.

The third means is that an irradiation unit for irradiating with particles which do not have a bad influence on a semiconductor substrate (for example, Ar ions, oxygen ions, oxygen radicals etc.) and a reaction gas introduction unit for introducing a reaction gas into the sample chamber and for determining a gas status by chemically reacting between an introduced gas and an ion of the ion beam irradiation unit are further provided to the prior apparatus. After the processing, the alteration of the wiring and the section of the sample and/or observing the section of the sample, while introducing the reaction gas into the chamber, the sample is cleaned by the irradiation and sputtering with the particle beam, which does not have a bad influence on the sample. The ions removed by irradiation with the particle beam chemically react with the reaction gas and the reacted ions enter into the gas state. And then that gas is exhausted. Therefore, without re-adhering with the doped ions, the ions which irradiate to the sample are removed from the sample.

The fourth means is that an irradiation unit for irradiating with particles which do not have a bad influence on a semiconductor substrate (for example, Ar ions, oxygen ions, etc.) and an organic gas blowing unit for blowing an organic gas, which reacts with the ion beam and deposits as a hard fusing metal film, at the sample surface, are further provided to the prior apparatus. The sample surface which is processed and/or observed by the irradiation with the focused ion beam is blown by the organic gas and irradiated with the particle beam which do not have a bad influence on a semiconductor substrate. The hard fusing metal film is formed on the sample.

The fifth means is that an irradiation unit for irradiating with an energy beam such as a laser beam or an electron beam and an organic gas blowing unit for blowing an organic gas, which reacts with the ion beam and deposits as a hard fusing metal film, at the sample surface, are further provided to the prior apparatus. The sample surface which is processed and/or observed by the irradiation with the focused ion beam is blown by the organic gas and irradiated with the energy beam. The hard fusing metal film is formed on the sample by the energy beam assist CVD method.

Figure 6A:
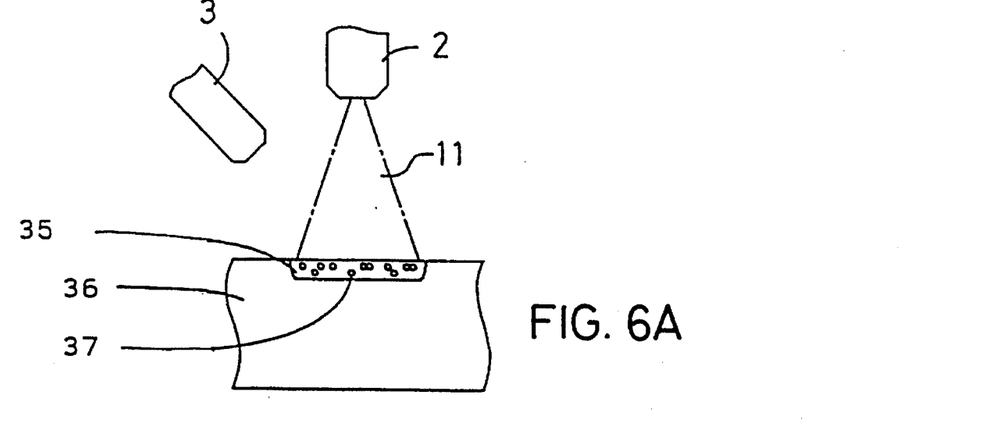
FIGS. 6A–6F are cross section drawings illustrating operations according to this invention.
Figure 6B:
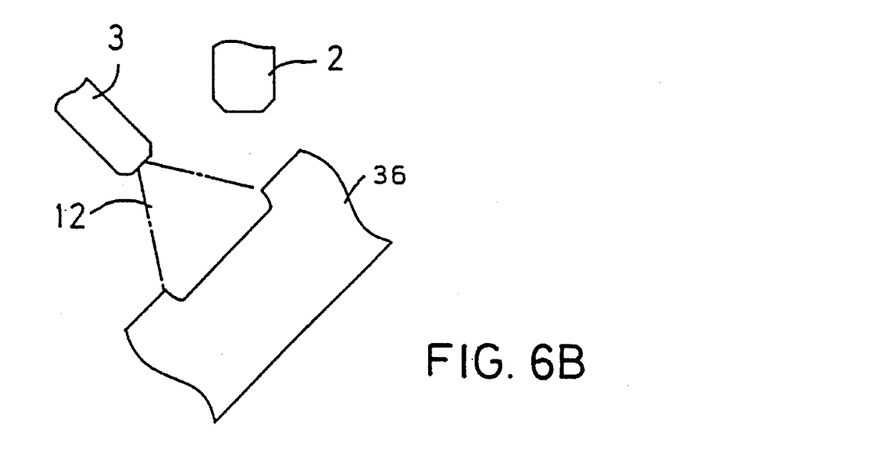

In the apparatus comprised as in the first means as the above, a portion of the ions which are irradiated to the sample as the focused ion beam is doped into the comparatively shallow section from the sample surface, and Ga ions are distributed as shown in FIG. 6A. By irradiation with particles which do not have a bad influence on a semiconductor substrate (for example, Ar ions, oxygen ions, oxygen radicals etc.), the portion is sputtered away as shown in FIG. 6B. As the ions (Ga) are distributed at the comparatively shallow section area, the damage to the sample by removing the portion is small. As Ar is an inert element, there exists no considerable influence on the sample property through the doping Ar ions. Even in the case that oxygen is used and oxygen reacts with Si to form a dioxide silicate, it also has a minimal influence on the sample.

Figure 6C:
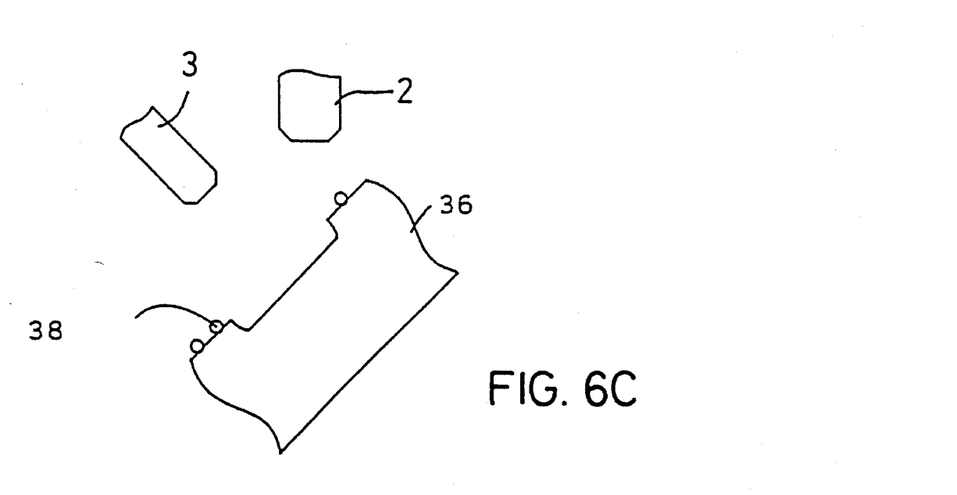

In the apparatus comprised as in the second means as the above, as shown in FIG. 6C, Ga ions 37 which are sputtered by the Ar ion beam 12 often re-adhere (restick) to the sample surface. Since the Ga ions are just attached on the sample surface, they can be eliminated by cleaning by a wet process and etching a natural oxide film with a liquid solution of hydrofluoric acid.

Figure 6D:
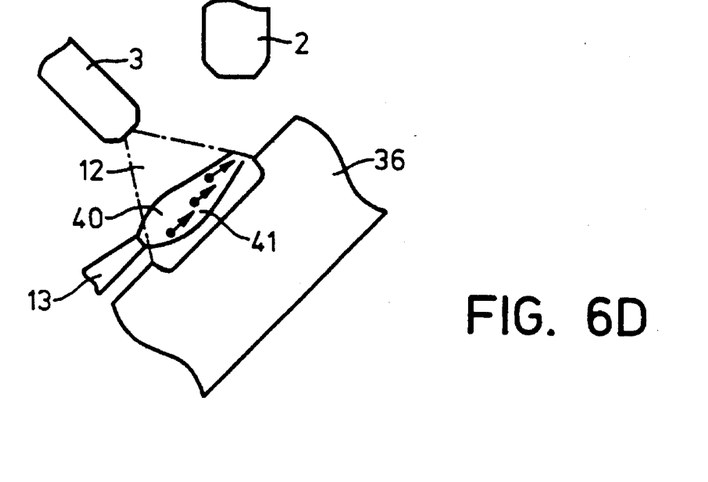

In the apparatus comprised as in the third means as the above, as shown in FIG. 6D, while introducing a chlorine gas 40 by a reaction gas introduction unit 13, the sample surface is sputtered with the Ar ion beam 12 from the irradiation unit 3. The sputtered Ga ions are chemically reacted with the chlorine gas 40 to form gallium tri-chloride 41. As gallium tri-chloride 41 has low vapor pressure, gallium tri-chloride 41 enters the gas state and is exhausted. The Ga ions removed from the sample can not re-adhere to the sample surface.

Figure 6E:
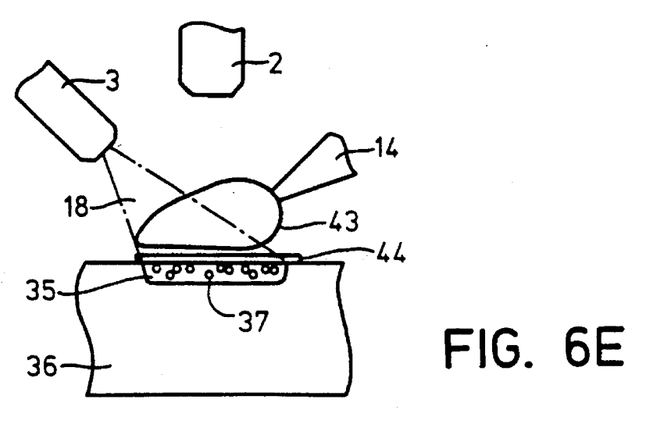

In the apparatus comprised as in the fourth means as the above, as shown in FIG. 6E, an organic metal compound gas 43 from an organic gas blowing unit 14 is blown onto the impurity doped area 35 which contains Ga ions 37 and the area is irradiated with the Ar ion beam 18. The area is formed with a high fusing metal film by CVD assisted by the Ar ion beam 18. Therefore, auto-doping of Ga ion doped in the Si substrate 36 can not occur. Although the hard fusing metal film includes the Ar element from the Ar beam, it is an inert element, and it has no influence on the Si substrate 36. Therefore, it invites no problem even in the case that those particles are auto-doped in other manufacturing equipments.

Figure 6F:
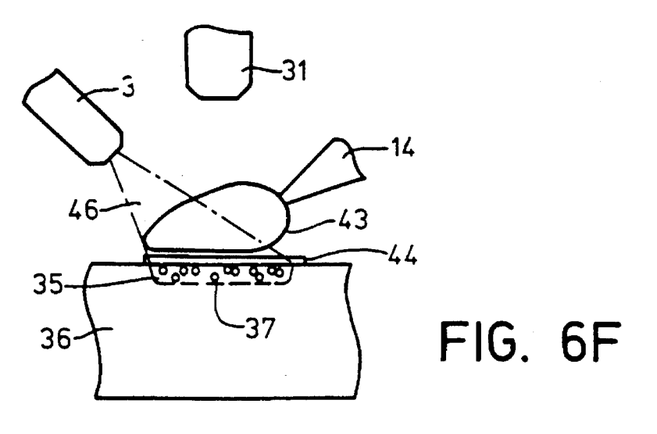

In the apparatus comprised as in the fifth means as the above, as shown in FIG. 6F, a laser beam unit provides an energy beam. an organic compound gas 43 is blown by the organic gas blowing unit 14 at the impurity (Ga ions 37) doped area 35. At this time, the laser beam irradiates the same area for depositing a hard fusing metal by the reaction. Therefore, Ga ions 37 doped into the Si substrate 36 cannot be auto-doped. As the hard fusing metal deposition is assisted by the laser, it does not include impurity.

DESCRIPTION OF THE PREFERRED EMBODIMENTS

Embodiments of this invention will be described hereinafter with reference to the Figures.

Figure 1:
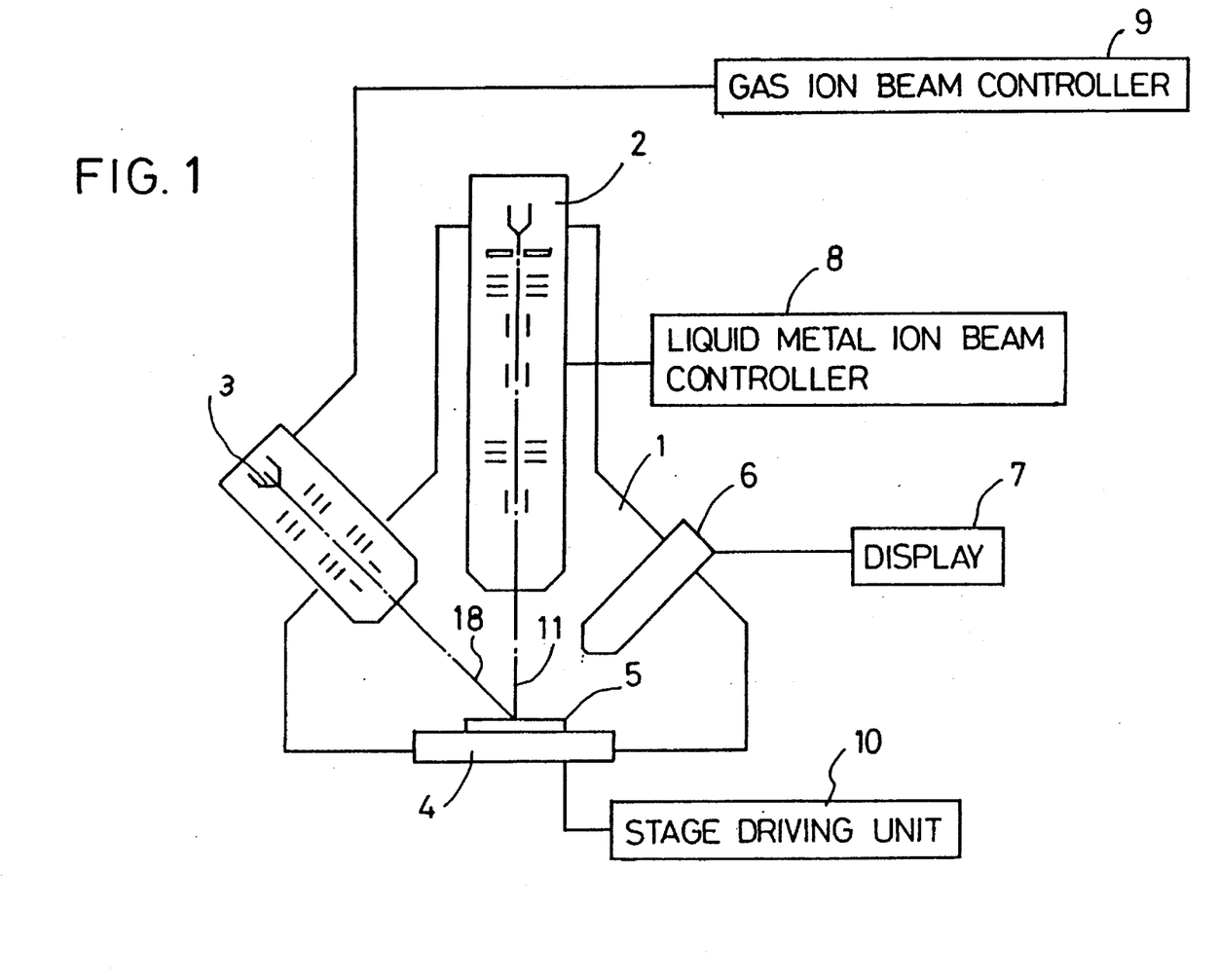
FIG. 1 shows the cross section one embodiment of the present invention.

FIG. 1 shows an outline drawing of any embodiment of focused ion beam apparatus according to the invention. The sample 5 is set on the sample stage 4 which is movable in X and Y directions. A sample chamber 1 contains a liquid metal ion beam irradiation unit 2 which generates a fine focused liquid metal ion beam 11 and irradiates a predetermined area with the focused ion beam by scanning, and a gas ion beam irradiation unit 3 which generates a gas ion beam and irradiates a predetermined area with the gas ion beam by scanning.

The output, on-off switching, scanning area, etc. of each ion beam irradiation unit 2, 3 is controlled by a liquid metal ion beam control unit 8 and a gas ion beam control unit 9, respectively. And secondary charged particles generated by the irradiation with each irradiation unit 2, 3 are detected by detector 6 which is provided near sample 5. An image of the sample 5 is displayed on a display 7 based on the signals of the detector 6.

On the liquid metal ion beam irradiation unit 2, a focusing lens (which is not shown in FIG. 7) is provided to focus the liquid metal ion beam 11 very finely in order to etch the predetermined area on the sample 5 surface finely and deeply. In order that the liquid metal ion beam 11 can be focused very finely, it is necessary to provide a liquid metal ion source from which a high energy ion beam can be obtained. And since the liquid metal ion beam 11 is focused to 1 μm or less, it is small enough, compared to the size of the sample 5.

The gas ion beam irradiation unit 3 is provided in the sample chamber 1, in that the gas element ion beam 18 can irradiate to the area irradiated by the liquid metal ion beam 11 on the sample 5. Such gas element has no bad influence on the properties of the sample. And the gas ion beam 18 is not used for fine etching the sample 5 surface, but for etching and removing the sample 5 surface by sputtering deeply where the liquid metal ions are doped and a property of the sample is changed by the irradiation with the liquid metal ion beams. Therefore, it is not necessary for the area irradiated with the gas element ion beam to be rigidly limited on the predetermined area of the sample 5 surface. Its beam diameter can be a little bit bigger than that of the liquid metal ion beam 11, but, of course, should be smaller than the sample 5.

The focused liquid metal ion beam 11 generated from the liquid metal ion beam irradiation unit 2 irradiates to the sample 5 set on the sample stage 4. By the action of scanning electrodes and blanking electrodes (not shown in FIG. 1) included in the liquid metal ion beam irradiation unit 2, the focused liquid metal ion beam 11 repeatedly scans the predetermined area of the sample 5. The sample 5 at the predetermined area is removed by the sputtering, and then around the boundary of the predetermined area on the sample 5, the cross-section of the sample 5 is exposed. If the sample is a semiconductor, the wiring at the boundary is cut and the cross-section of the wiring is exposed.

When the ion species of the liquid metal ion beam irradiation unit 2 is Ga, the predetermined area of the sample 5 irradiated with the Ga ion beam is doped by Ga ions into a comparatively shallow part of the sample 5. And the ion beam 18 of the gas element which has no bad influence on the property of the sample 5 irradiates such part from the gas ion beam irradiation unit 3. In this case, as the gas element of the gas ion beam 18, Ar ions are used. Due to Ar ion beam 18, the near surface where Ga ions are doped on the sample 5, is sputtered and removed.

When the materials, which include the ions which are removed by the sputtering of the above-mentioned method restick on the sample 5 surface, a wet cleaning and an etching with aqueous solution of hydrofluorine acid are performed. Through those processes, the sample which is processed and/or observed with the focused liquid metal ion beam can be returned again to the manufacturing process.

Figure 2:
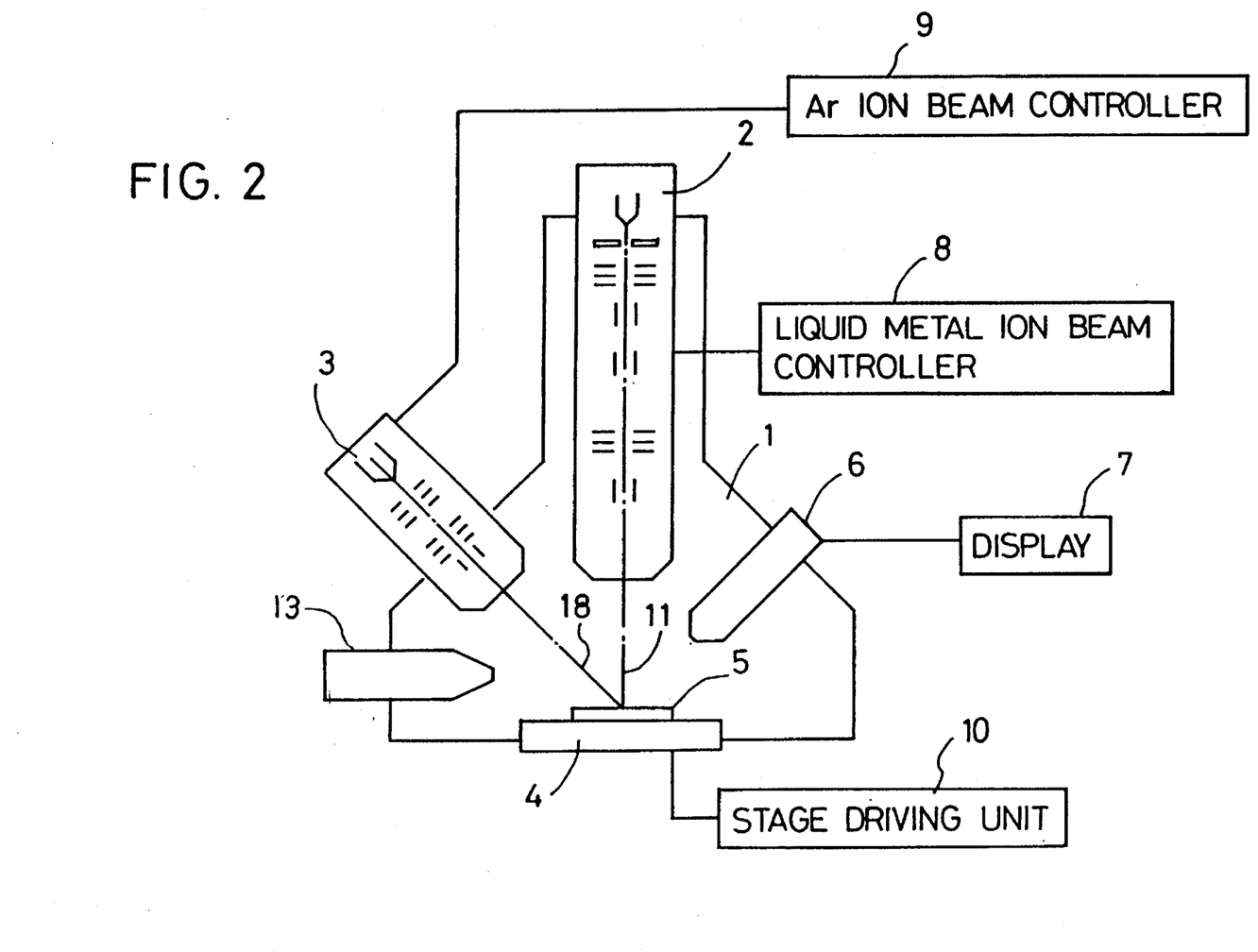
FIG. 2 shows another cross section of the invention.

FIG. 2 shows an outline of another embodiment of the invention. The sample chamber 1 contains the liquid metal ion beam irradiation unit 2 for generating the finely focused Ga ion beam 11, the gas ion beam irradiation unit 3 for generating a Ar ion beam, and a reacting gas introduction unit 13 for introducing chlorine gas to the sample chamber 1. The focused liquid metal ion beam 11 irradiates the sample 5 set on the sample stage 4. When the focused ion beam 11 of Ga ions irradiates the sample 5, some of the Ga ions are doped into the comparatively shallow part of the sample 5 surface and form a doping layer. Next, the area which is irradiated with the focused liquid metal ion beam is irradiated with the Ar ion beam. By irradiation with the Ar ion beam, the doped area is sputtered and removed. At this time, a small amount of chlorine gas is introduced to the sample chamber 1 by the reacting as introduction unit 13 concurrently with the irradiation with the Ar ion beam. Ga ions sputtered by Ar ions react with chlorine gas to form gallium tri-chloride which has a high vapor pressure, and it is exhausted from the sample chamber 1. As a result, Ga ions are removed from the sample 5, and the sample which is processed and/or observed with the focused liquid metal ion beam can be returned again to the manufacturing process.

Figure 3:
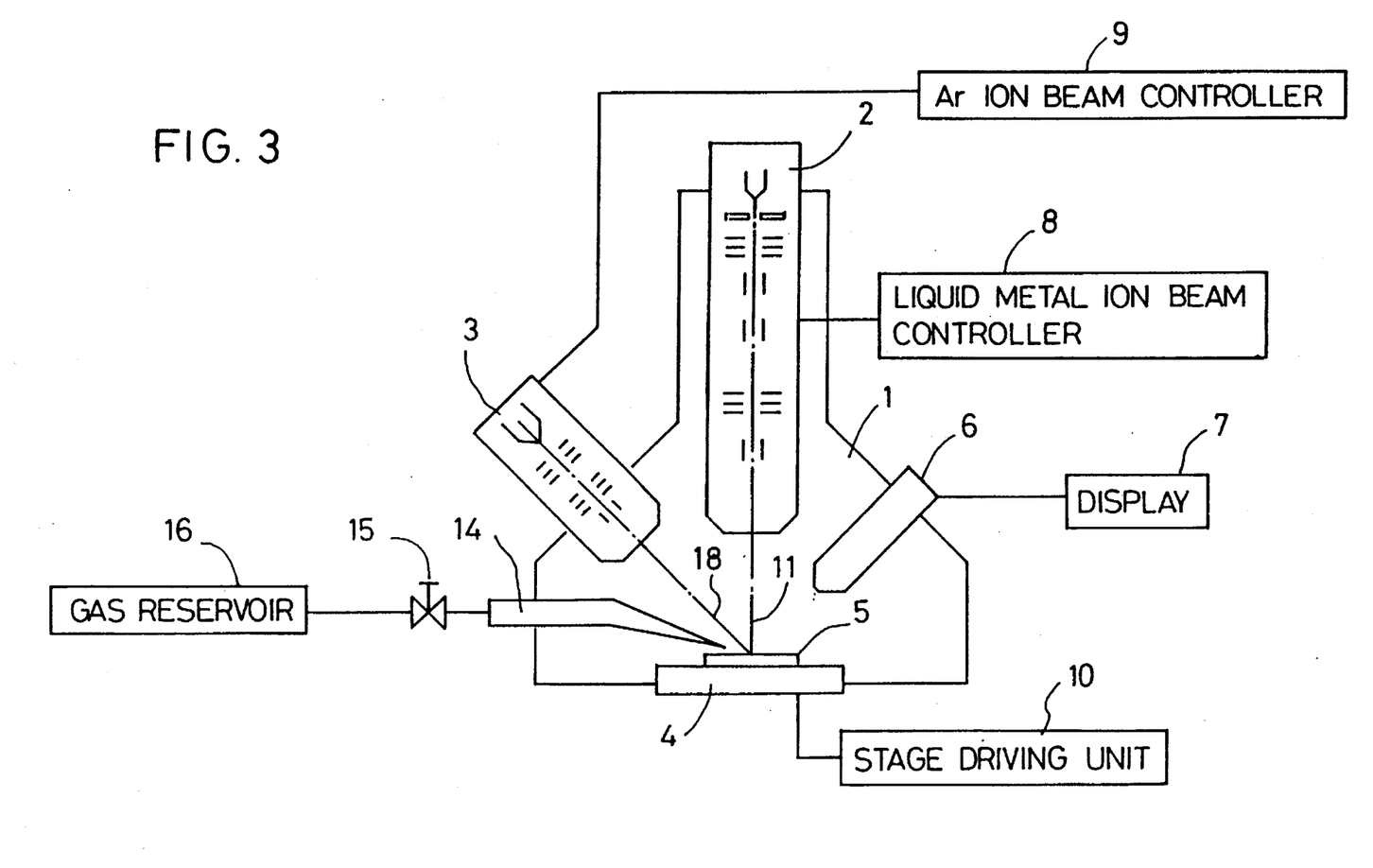
FIG. 3 shows the other cross section of the invention.

FIG. 3 shows the outline drawing of another embodiment. The sample chamber 1 contains the liquid metal ion beam irradiation unit 2 for generating the finely focused Ga ion beam 11, the gas ion beam irradiation unit 3 for generating an Ar ion beam, a gas reservoir 16 for string hexacarbonyl tungsten and a gas blowing nozzle 14 connected to the gas reservoir 16.

As the gas blowing nozzle 14 is provided for locally directing hexacarbonyl tungsten vapor to the area which is irradiated with the focused liquid metal ion beam 11, the end of nozzle 14 is set close to the sample 5 surface. An ion optics of the liquid metal ion beam irradiation unit 2 is controlled by a liquid metal ion beam controller 8 so that the predetermined area is repeatedly irradiated with the focused liquid metal ion beam. When the focused ion beam 11 of Ga ions irradiates the sample 5, some of the Ga ions are doped into the comparatively shallow part of the sample 5 surface and form a doping layer. All of the area where the Ga ions are locally doped is irradiated with the gas ion beam 18, and at the same time, the same area which was irradiated with the Ga ion beam 11 is contacted by the vapor of hexacarbonyl tungsten. And then a tungsten film is formed at the area. Since Ga ions (doped) are existing under the tungsten film, the Ga ions will not experience auto-doping, and the sample which is processed and/or observed with the focused liquid metal ion beam can be returned again to the manufacturing process.

Figure 4:
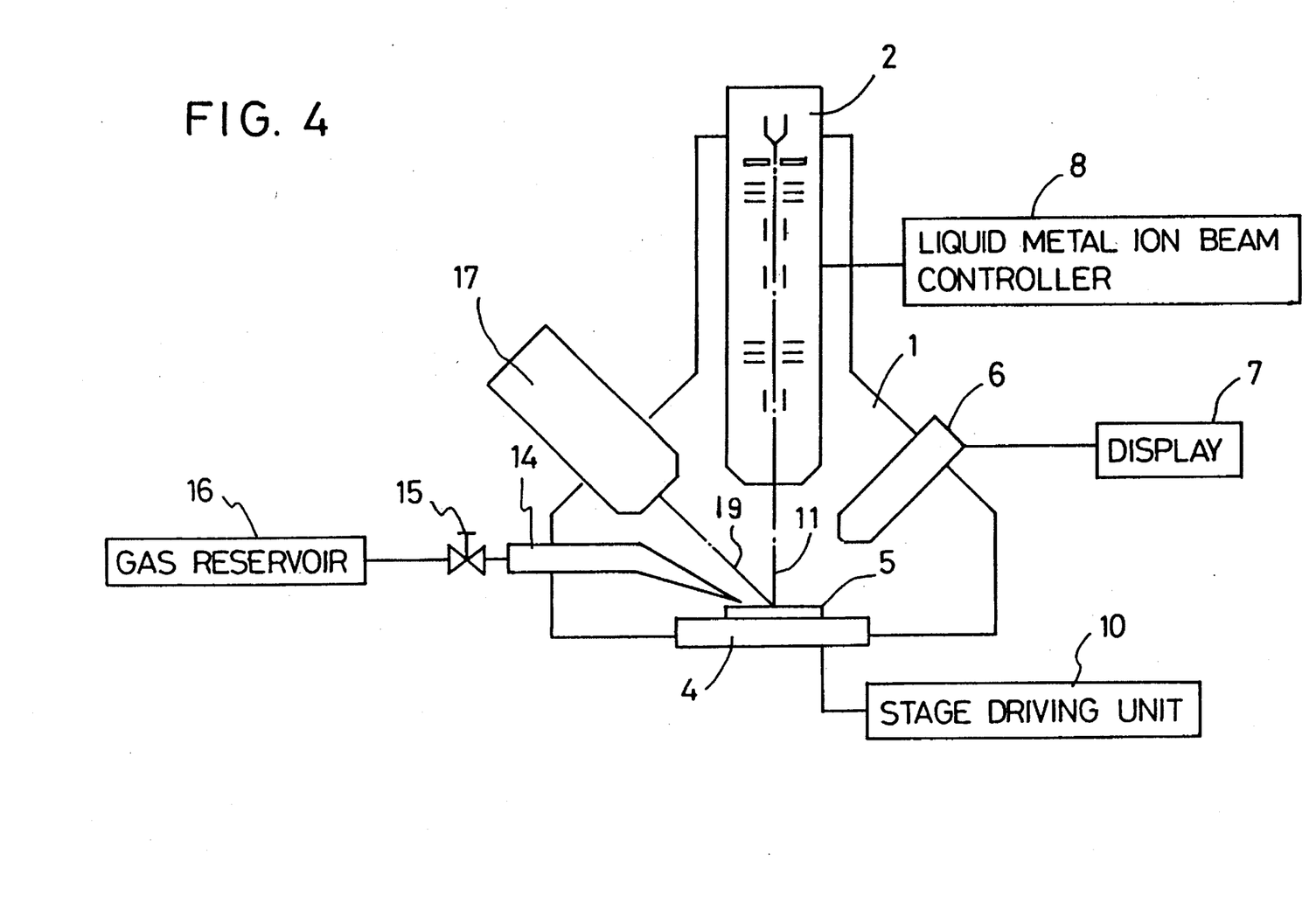
FIG. 4 shows the further more cross section of the invention.

FIG. 4 shows an outline drawing of another embodiment of the invention. The sample chamber 1 contains the liquid metal ion beam irradiation unit 2 for generating the finely focused Ga ion beam 11, a laser beam irradiation unit 17 for generating a laser beam 19, a gas reservoir 16 for storing hexacarbonyl tungsten and a gas blowing nozzle 14 connected to the gas reservoir 16. As the focused liquid metal ion beam irradiates to the sample 5 set on the sample stage 4, the sample 5 is processed and/or observed. When the focused ion beam 11 of Ga ions is irradiated to the sample 5, some of the Ga ions are doped into a comparatively shallow part of the sample 5 surface and form a doping layer. All areas where the Ga ions are locally doped are irradiated with the laser beam 18, and at the same time, the same area which was irradiated with Ga ion beam 11 receives the vapor of hexacarbonyl tungsten. And then a tungsten film is formed at the area. Since Ga ions (doped) are present under the tungsten film, the Ga ions will not experience auto-doping, and the sample which is processed and/or observed with the focused liquid metal ion beam can be returned again to the manufacturing process.

Further, the ion source of the liquid metal ion beam 11 in the embodiments illustrated in FIG. 1 through FIG. 4 can be Cs ions, etc., instead of Ga ions, by which the same effective result can be obtained. And the ion source of the gas ion beam 18 in the embodiments illustrated in FIG. 1 through FIG. 3 can be oxygen ions, too, or can be, instead of ions, oxygen radicals.

According to this invention as explained hereinabove, the sample, which is contaminated by the irradiation with the liquid metal ion source, can be returned to the manufacturing process.

What is claimed is:

1. An ion beam processing method comprising:

removing a predetermined area of a sample by irradiation with a repeatedly scanning and finely focused liquid metal ion beam by sputtering;

irradiating a area which includes at least the predetermined area with a ion beam of gas element, a diameter of said gas element ion beam being larger than that of the focused liquid metal ion beam.

2. A focused ion beam apparatus, comprising:

a liquid metal ion beam irradiation unit for irradiating a predetermined area of a sample with a finely focused liquid metal ion beam in a manner to modify a property of a layer of the sample in the predetermined area; and a gas ion beam irradiation unit for irradiating the predetermined area with an ion beam composed of ions of a gaseous element in a manner to remove the layer of the sample in the predetermined area.

3. Apparatus as defined in claim 2 wherein said liquid metal ion beam irradiation unit is constructed for repeatedly scanning the predetermined area in order to process the layer of the sample.

4. Apparatus as defined in claim 3 further comprising an organic compound gas blowing unit for blowing an organic compound gas at the predetermined area so that organic compound gas cooperates with the liquid metal ion beam to form a refractory metal film.

5. Apparatus as defined in claim 2 further comprising an organic compound gas blowing unit for blowing an organic compound gas at the predetermined area so that organic compound gas cooperates with the liquid metal ion beam to form a refractory metal film.

* * * * *